United States Patent
Chen et al.

(10) Patent No.: US 9,341,938 B2
(45) Date of Patent: May 17, 2016

(54) MASK PLATE, EXPOSURE SYSTEM AND EXPOSING METHOD

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Zhenxia Chen, Beijing (CN); Fan Li, Beijing (CN); Ni Jiang, Beijing (CN)

(73) Assignees: BOE TECHNOLOGY GROUP CO., LTD. (CN); CHENGDU BOE OPTOELECTRONICS TECHNOLOGY CO., LTD. (CN)

(*) Notice: Subject to any disclaimer, the term of this patent is extended or adjusted under 35 U.S.C. 154(b) by 133 days.

(21) Appl. No.: 14/104,394

(22) Filed: Dec. 12, 2013

(65) Prior Publication Data
US 2014/0160454 A1    Jun. 12, 2014

(30) Foreign Application Priority Data
Dec. 12, 2012   (CN) .......................... 2012 1 0537158

(51) Int. Cl.
G03F 1/24      (2012.01)
G03F 1/50      (2012.01)
G03F 7/20      (2006.01)
G03F 1/52      (2012.01)
G03F 1/54      (2012.01)

(52) U.S. Cl.
CPC .. *G03F 1/24* (2013.01); *G03F 1/50* (2013.01); *G03F 1/52* (2013.01); *G03F 1/54* (2013.01); *G03F 7/70433* (2013.01)

(58) Field of Classification Search
CPC .............. G03F 1/24; G03F 1/50; G03F 1/52; G03F 1/54; G03F 7/201; G03F 7/70433
USPC ........................................ 430/5; 355/67, 77
See application file for complete search history.

(56) References Cited

U.S. PATENT DOCUMENTS

2007/0008510 A1*  1/2007  Takizawa ................ 355/69
2009/0111032 A1   4/2009  Woo
2011/0281206 A1* 11/2011  Guo et al. ................ 430/5

FOREIGN PATENT DOCUMENTS

CN    1392443     1/2003
CN    102243444   11/2011

OTHER PUBLICATIONS

First Office Action issued in corresponding Chinese Application No. 201210537158.3 dated Sep. 13, 2013.

* cited by examiner

*Primary Examiner* — John A McPherson
(74) *Attorney, Agent, or Firm* — Baker Hostetler LLP (57) ABSTRACT

The invention is directed to a mask plate, an exposure system comprising a mask plate and an exposing method. The mask plate comprises a light transmitting region, a light shielding region, and a light reflecting region for reflecting exposure light to the light shielding region, with the pattern of the light from the transmitting region and reflecting region corresponding to the pattern of the region exposed to a first and a second substrate respectively. When exposure light irradiates on the mask plate, it passes through the light transmitting region and exposes the first substrate. The light reflecting region reflects the exposure light to a principal reflection structure which further reflects the light for exposing the second substrate. The first and second substrate may be exposed via the same mask plate to minimize waste of exposure light to save production time and efficiency.

18 Claims, 3 Drawing Sheets

Prior art

MASK PLATE, EXPOSURE SYSTEM AND EXPOSING METHOD

CROSS REFERENCE

The present application claims priority to the Chinese application No. 201210537158.3 filed on Dec. 12, 2012, entitled with "Mask Plate, Exposure system and Exposing Method", the entire contents of which are incorporated herein by reference.

FIELD OF THE INVENTION

The present invention relates to the technical field of displays, and in particular, to a mask plate, an exposure system and an exposing method.

BACKGROUND OF THE INVENTION

Thin Film Transistor Liquid Crystal Display (TFT-LCD) takes the leading position in the current field of displays, and products thereof have been widely used in the modern digital informatization devices due to their advantages such as small volume, low power consumption, no radiation and high resolution, etc.

A TFT-LCD is formed by laminating an array substrate and a color filter substrate, wherein on the array substrate, gate lines and data lines that intersect with each other and define pixel regions are formed, and a pixel electrode and a thin film transistor are formed on each pixel region; and on the color filter substrate, a black matrix and a color filter are formed. The liquid crystal between the array substrate and the color filter substrate generates different rotations under the action of different strengths of the electric field, thereby attaining different display brightness; and a color image display effect may be obtained under the coordination of the color filter on the color filter substrate.

In the process of forming an array substrate, the forming of a gate and a gate line thereof, a gate insulating layer, a semiconductor layer, a source and drain electrode layer, a data line, a passivated protection layer and a pixel electrode may be achieved via a photolithographic process. During the photolithographic process, a photoresist is coated, and the photoresist layer is exposed and developed via a mask plate, and then a patternized film is obtained via an etching and peeling process. The color filter of the color filter substrate may be also formed via a photolithographic process. During the above process of exposing the photoresist via a mask plate, for the substrates with different composition patterns, different mask plates are needed to be used to expose the photoresist. Moreover, during each exposing process, the exposure light irradiated on a light shielding region of the mask plate are all absorbed, dissipated and thus wasted, thereby the manufacturing cost will be increased, and the production efficiency will also be lowered.

SUMMARY OF THE INVENTION

The technical problem to be solved by the invention is to provide a mask plate, an exposure system and an exposing method, which can solve the problems that different mask plates are needed to be used to expose the photoresist for the substrates with different composition patterns and the exposure light irradiated on a light shielding region of the mask plate is not utilized during each exposing process.

To solve the above technical problems, one embodiment of the invention provides the following technical solution:

According to one aspect of the invention, there provides a mask plate comprising a light transmitting region and a light shielding region, wherein the pattern of the light transmitting region corresponds to the pattern of the region to be exposed of a first substrate, a light reflecting region for reflecting exposure light is provided in the light shielding region, and the pattern of the light reflecting region corresponds to the pattern of the region to be exposed of a second substrate.

Further, the light reflecting region lies on one side of the mask plate that is far from the first substrate.

One embodiment of the invention further provides an exposure system, comprising a mask plate and a principal reflection structure that is provided above the mask plate, wherein the mask plate comprises a light transmitting region and a light shielding region, the pattern of the light transmitting region corresponds to the pattern of the region to be exposed of a first substrate, and a light reflecting region for reflecting exposure light is provided on the light shielding region, and the pattern of the light reflecting region corresponds to the pattern of the region to be exposed of a second substrate;

When exposure light irradiates on the mask plate, passes through the light transmitting region of the mask plate and exposes the first substrate, the light reflecting region of the mask plate reflects the exposure light to the principal reflection structure, and the principal reflection structure further reflects the light, which is reflected by the light reflecting region, to the region to be exposed of the second substrate to expose the second substrate.

Moreover, the system further comprises:

a subordinate reflection structure, for receiving the light reflected by the principal reflection structure and reflecting it to the region to be exposed of the second substrate.

Moreover, the system further comprises:

a principal substrate table, for supporting the first substrate;

a light source, for providing the exposure light; and a subordinate substrate table, for supporting the second substrate.

Moreover, after being reflected by the subordinate reflection structure, the exposure light irradiates on the region to be exposed of the second substrate via vertical incidence.

Moreover, the reflection plane of the principal reflection structure is vertical to the reflection plane of the subordinate reflection structure.

Moreover, an angle γ between the principal substrate table and the reflection plane of the principal reflection structure is 45°.

Moreover, the system further comprises:

a UM lens system, which is provided between the subordinate reflection structure and the second substrate.

Moreover, the system further comprises:

a UM lens system, which is provided between the first substrate and the mask plate.

Moreover, the principal reflection structure comprises a light transmitting plate and a reflective layer formed on the light transmitting plate, and the reflective layer is used to reflect the light reflected by the light reflecting region of the mask plate.

One embodiment of the invention further provides an exposing method, wherein a substrate is exposed by utilizing the above exposure system, and the exposing method comprises:

exposing a second substrate via exposure light reflected by the light reflecting region of the mask plate when a first substrate is exposed by utilizing the mask plate.

The embodiments of the invention have the following beneficial effects:

In the above embodiments, the first substrate and the second substrate may be exposed via the same mask plate, without the need to change the mask plate. Moreover, the exposure light that are not used when the first substrate is exposed may be utilized to expose the second substrate. Thus not only the purchase and maintenance of mask plates can be saved, but also the waste of exposure light can be avoided, thereby lowering the production cost of liquid crystal display panels, saving the production time, and improving the production efficiency.

BRIEF DESCRIPTION OF THE INVENTION

REFERENCE LABEL

1a Principal Substrate Table
1b Subordinate Substrate Table
2a First Substrate
2b Second Substrate
3 Mask Plate
4 Light Reflecting Region In The Mask plate
5a Reflection Structure 1 In A Reflecting Apparatus
5b Reflection Structure 2 In A Reflecting Apparatus
6 Light transmitting Region In A Mask Plate
7 Light shielding Region In A Mask Plate

DETAILED DESCRIPTION OF THE EMBODIMENTS

In order to make the technical problems to be solved, the technical solutions and the advantages of the embodiments of the invention more apparent, a detailed description will be given below in conjunction with the drawings and the specific embodiments.

Figures 1, 2:
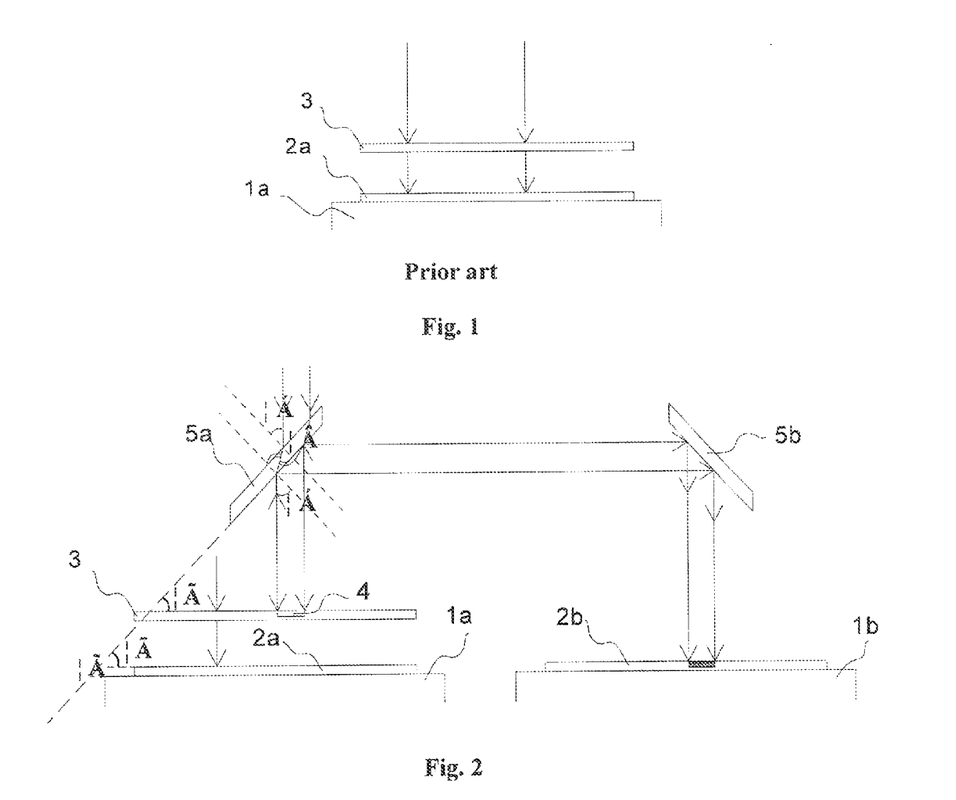
FIG. 1 is a structural representation of the exposure system of the existing exposing technology.
FIG. 2 is a structural representation of the exposure system according to one embodiment of the invention.

FIG. 1 is a structural representation of an exposure system of the prior art. As shown in FIG. 1, an exposure system includes a substrate table 1a for supporting a substrate 2a, a photoresist is coated on the substrate 2a, and a mask plate 3 parallel with the substrate table 1a is provided above the substrate table 1a. Additionally, the exposure system further comprises an exposing light source (not shown). Exposure light emitted by the exposing light source irradiates vertically on an upper surface of the mask plate 3, and the exposure light irradiating on a light transmitting region of the upper surface of the mask plate 3 passes through the mask plate 3 and exposes the substrate 2a placed on the substrate table 1a. During the process that the photoresist is exposed by utilizing the mask plate 3, when a patternizing process is completed and the next exposure is performed, the corresponding mask plate needs to be changed. Moreover, during each exposing process, the exposure light irradiated on a light shielding region of the mask plate are all absorbed, dissipated and thus wasted, thereby increasing the manufacturing cost of liquid crystal display panels and lowering the production efficiency.

To solve the above problems, the embodiments of the invention provides a mask plate, an exposure system and an exposing method, which can solve the problems that different mask plates are need to be used to expose the photoresist for substrates with different composition patterns and the exposure light irradiated on a light shielding region of the mask plate are not utilized during each exposing process.

One embodiment of the invention provides a mask plate, which comprises a light transmitting region and a light shielding region, wherein the pattern of the light transmitting region corresponds to the pattern of the region to be exposed of a first substrate, a light reflecting region for reflecting exposure light is provided in the light shielding region, and the pattern of the light reflecting region corresponds to the pattern of the region to be exposed of a second substrate. Moreover, the light reflecting region lies on one side of the mask plate that is far from the first substrate.

By utilizing the mask plate, the second substrate may be exposed when the first substrate is exposed; and a plurality of substrates may be exposed at the same time via the same mask plate. Thus the manufacturing cost of liquid crystal display panels may be reduced, and the production efficiency may be improved.

One embodiment of the invention further provides an exposure system, which comprises a mask plate and a principal reflection structure that is provided above the mask plate, wherein the mask plate comprises a light transmitting region and a light shielding region, the pattern of the light transmitting region corresponds to the pattern of the region to be exposed of a first substrate, a light reflecting region for reflecting exposure light is provided in the light shielding region, and the pattern of the light reflecting region corresponds to the pattern of the region to be exposed of a second substrate; and when exposure light irradiates on the mask plate, passes through the light transmitting region of the mask plate and exposes the first substrate, the light reflecting region of the mask plate reflects the exposure light to the principal reflection structure, and the principal reflection structure further reflects the light, which is reflected by the light reflecting region, to the region to be exposed of the second substrate to expose the second substrate.

Moreover, the system further comprises:
a subordinate reflection structure, for receiving the light reflected by the principal reflection structure and reflecting it to the region to be exposed of the second substrate.

Moreover, the system further comprises:
a principal substrate table, for supporting the first substrate;
a light source, for providing exposure light; and
a subordinate substrate table, for supporting the second substrate.

Moreover, after being reflected by the subordinate reflection structure, the exposure light irradiates on the region to be exposed of the second substrate via vertical incidence.

Moreover, the reflection plane of the principal reflection structure is vertical to the reflection plane of the subordinate reflection structure.

Moreover, an angle γ between the principal substrate table and the reflection plane of the principal reflection structure is 45°.

Moreover, the system further comprises:
a UM lens system, which is provided between the subordinate reflection structure and the second substrate.

Moreover, the system further comprises:

a UM lens system, which is provided between the first substrate and the mask plate.

Moreover, the principal reflection structure comprises a light transmitting plate and a reflective layer formed on the light transmitting plate, and the reflective layer is used to reflect the light reflected by the light reflecting region of the mask plate.

By utilizing the exposure system according to the embodiment of the invention, when the first substrate on the principal substrate table is exposed, the second substrate on the subordinate substrate table will be exposed at the same time, and the first substrate and the second substrate may be exposed via the same mask plate, without the need to change the mask plate. Moreover, the exposure light, that are not used when the first substrate is exposed, may be utilized to expose the second substrate. Thus not only the purchase and maintenance of mask plates can be saved, but also the waste of exposure light can be avoided, thereby lowering the production cost of liquid crystal display panels, saving the production time, and improving the production efficiency.

One embodiment of the invention further provides an exposing method for exposing a substrate by utilizing the above exposure system, wherein the exposing method comprises:

exposing a second substrate via exposure light reflected by the light reflecting region of the mask plate when a first substrate is exposed by utilizing the same mask plate.

By utilizing the exposing method according to the embodiment of the invention, when the first substrate on the principal substrate table is exposed, the second substrate on the subordinate substrate table will be exposed at the same time, and the first substrate and the second substrate may be exposed via the same mask plate, without the need to change the mask plate. Moreover, the exposure light, that are not used when the first substrate is exposed, may be utilized to expose the second substrate. Thus not only the purchase and maintenance of mask plates can be saved, but also the waste of exposure light can be avoided, thereby lowering the production cost of liquid crystal display panels, saving the production time, and improving the production efficiency.

The mask plate, the exposure system and the exposing method according to the invention will be introduced below in detail in conjunction with the specific embodiments and the drawings.

Embodiment 1

FIG. 2 is a structural representation of an exposure system according to this embodiment, wherein the exposure system includes two exposing apparatuses. As shown in FIG. 2, a principal exposing apparatus includes: a principal substrate table 1a, for supporting a first substrate 2a; and a mask plate 3, which is provided above the principal substrate table 1a and is parallel with the principal substrate table 1a. The mask plate 3 includes a light transmitting region and a light shielding region, wherein a light reflecting region 4 (not shown in this figure) is provided in the light shielding region (not shown in this figure), and the pattern of the light transmitting region corresponds to the pattern of the region to be exposed of the first substrate 2a. A subordinate exposing apparatus includes: a subordinate substrate table 1b, for supporting a second substrate 2b, wherein the pattern of the light reflecting region 4 corresponds to the pattern of the region to be exposed of the second substrate 2b. The exposure system includes a reflection structure 1 5a (i.e., principal reflection structure) and a reflection structure 2 5b (i.e., subordinate reflection structure). In order to guarantee that, after being reflected by the subordinate reflection structure, the exposure light irradiates on the region to be exposed of the second substrate via vertical incidence, the reflection plane of the reflection structure 1 5a should be vertical to the reflection plane of the reflection structure 2 5b, and the exposing light source (not shown in this figure) should lie above the reflection structure 1 5a.

Figure 5:
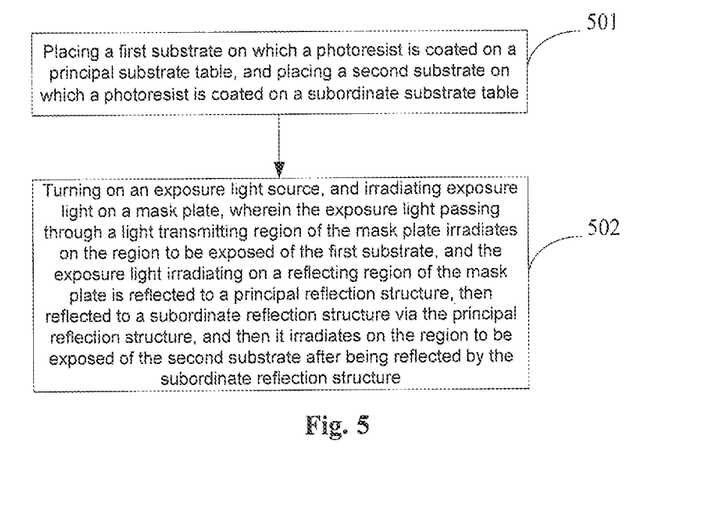
FIG. 5 is a schematic flow chart of the exposing method according to one embodiment of the invention.

FIG. 5 is a schematic flow chart of a method for exposing by employing the exposure system according to this embodiment. As shown in FIG. 5, the exposing method includes:

Step 501: placing a first substrate on which a photoresist is coated on a principal substrate table, and placing a second substrate on which a photoresist is coated on a subordinate substrate table;

Step 502: turning on an exposing light source, and irradiating exposure light on a mask plate, wherein the exposure light passing through a light transmitting region of the mask plate irradiates on the region to be exposed of the first substrate, and the exposure light irradiating on a light reflecting region of the mask plate is reflected to a principal reflection structure, then reflected to a subordinate reflection structure via the principal reflection structure, and then it irradiates on the region to be exposed of the second substrate after being reflected by the subordinate reflection structure.

When a first substrate 2a to be exposed is exposed, the exposing light source is turned on, and exposure light irradiates vertically down to a reflection structure 1 5a with an incidence angle of α. It may be seen that α is determined by γ, and it has the same value as γ, wherein γ is an angle between the principal substrate table and the principal reflection structure. The reflection structure 1 5a is consisted of a light transmitting plate and a reflective layer formed on the light transmitting plate, and the reflective layer is used to reflect the light reflected by the light reflecting region of the mask plate, thus the exposure light may pass through the reflection structure 1 5a. It is hypothesized that the refractive index of the reflection structure 1 5a is n, the emergence angle β of the exposure light after being refracted will be β=arc sin (sin α/n), and when the emergence light reaches the lower surface of the reflection structure 1 5a, the incidence angle will still be β, and the emergence angle will be α. Then, the exposure light penetrating through the reflection structure 1 5a irradiates vertically on a mask plate 3, and after passing through the light transmitting region on the mask plate 3, it irradiates vertically on the region to be exposed of the first substrate 2a. When the exposure light penetrating through the reflection structure 1 5a irradiates vertically on a light reflecting region 4 on the mask plate 3, it reaches a surface of the reflection structure 1 5a after being reflected vertically, and at this point, the incidence angle is α, and the exposure light irradiates on the reflection structure 2 5b after being reflected by the reflection structure 1 5a. Since the reflection structure 1 5a and the reflection structure 2 5b are vertical to each other, the exposure light, after being reflected by the reflection structure 2 5b, irradiates vertically to the region to be exposed on the second substrate 2b.

Preferably, γ may be set as 45°, thus it may guarantee that the exposure light is in a horizontal direction after being reflected by the reflection structure 1 5a, and the exposure light that irradiates on the region to be exposed of the second substrate 2b after being reflected by the light reflecting region 4 is not deformed.

By the exposure system according to this embodiment, two substrates may be exposed at the same time in the same process, and two substrates may also be exposed at the same time in the different processes, so long as that the region to be exposed of the second substrate 2b is contained in the light shielding region of the mask plate 3, that is the location and size of the region to be exposed of the second substrate 2b do not exceed the light shielding region of the mask plate 3.

Figure 3A:
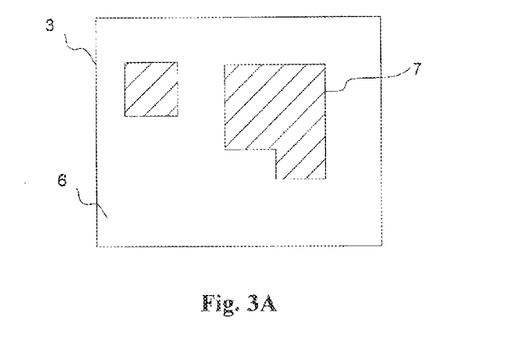
FIG. 3A is a bottom view of the mask plate according to Embodiment 1 of the invention.
Figure 3B:
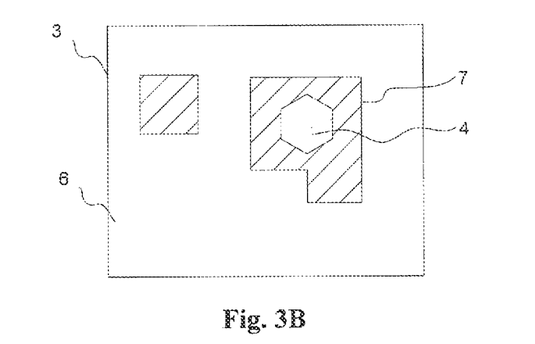
FIG. 3B is a top view of the mask plate according to Embodiment 1 of the invention.

Specifically, in this embodiment, the principal exposing apparatus may be used to manufacture a source electrode, a drain electrode and a data line, and the subordinate exposing apparatus may used to manufacture a via hole that connects the drain electrode metal layer and a pixel electrode, at this point, the patterns on the mask plate 3 are as shown in FIG. 3A and FIG. 3B. FIG. 3A is a bottom view seen upward from the lower surface of the mask plate 3, the mask plate 3 includes a light transmitting region 6 and a light shielding region 7, and when seen upward from the lower surface of the mask plate 3, only the light transmitting region 6 and the light shielding region 7 can be distinguished. When exposure light irradiates on the mask plate 3, the exposure light may pass through the light transmitting region 6 and irradiate on the first substrate 2a to expose a pattern, but it cannot pass through the light shielding region 7. FIG. 3B is a top view seen downward from the upper surface of the mask plate 3, a light reflecting region 4 is provided in the light shielding region 7, and when seen downward from the upper surface of the mask plate 3, the light transmitting region 6, the light shielding region 7 and the light reflecting region 4 can be seen. The location and size of the pattern of the light reflecting region 4 correspond to the location and size of the via hole to be formed, thus it may not use an independent mask plate for the via hole. When the exposure light irradiates on the light shielding region 7, the exposure light that irradiates on the light reflecting region 4 of the light shielding region will be reflected by the above principal reflection structure and subordinate reflection structure, and then irradiate on the second substrate 2b that is placed on the subordinate substrate table 1b, and expose a desirable pattern.

Moreover, in order to optimize the exposing effect, the path on which the exposure light reaches the first substrate 2a and the path on which the exposure light reaches the second substrate 2b may be adjusted, so that light intensity of the exposure light that reaches the first substrate 2a will be consistent with the light intensity of the exposure light that reaches the second substrate 2b. Specifically, the light intensity may be adjusted by adjusting the distance between the mask plate 3 and the principal substrate table and/or adjusting the distance between the reflection structure 2 5b and the subordinate substrate table.

Moreover, the requirement on the exposing precision of the array substrate is high, but the directivity of the light source is poor together with the diffraction effect of a light, when a parallel light is projected, after it propagates for a long distance and passes through a mask plate, no clear pattern can be formed. Thus it needs to reconverge the light to improve the precision and the light intensity. Therefore, a UM lens system may be provided between the mask plate 3 and the first substrate 2a, and/or a UM lens system may be provided between the reflection structure 2 5b and the second substrate 2b, and by adjusting the UM lens systems, the light intensity and precision of the light reaching the first substrate 2a and the light intensity and precision of the light reaching the second substrate 2b can be made to meet the requirements at the same time. The ultra mirror (UM) lens system mainly includes an isosceles trapezoid prism, a concave lens and a convex lens, etc which are commonly used in the prior art.

By applying the exposure system according to this embodiment, when a substrate on the principal exposing apparatus is exposed, a substrate on the subordinate exposing apparatus may be exposed at the same time, without the need to change the mask plate. Moreover, the exposing processes may be performed at the same time, thus not only the purchasing and maintenance of mask plates may be saved, but also the waste of exposure light can be avoided, thereby lowering the production cost of liquid crystal display panels, saving the production time, and improving the production efficiency.

Embodiment 2

FIG. 2 is a structural representation of an exposure system according to this embodiment, wherein the exposure system includes two exposing apparatuses. As shown in FIG. 2, a principal exposing apparatus includes: a principal substrate table 1a, for supporting a first substrate 2a; and a mask plate 3, which is placed above the principal substrate table 1a and parallel with the principal substrate table 1a. The mask plate 3 includes a light transmitting region and a light shielding region, a light reflecting region 4 (not shown in this figure) is provided in the light shielding region (not shown in this figure), wherein the pattern of the light transmitting region corresponds to the pattern of the region to be exposed of the first substrate 2a. A subordinate exposing apparatus includes a subordinate substrate table 1b, for supporting a second substrate 2b, wherein the pattern of the light reflecting region 4 corresponds to the pattern of the region to be exposed of the second substrate 2b. A reflection structure 1 5a (i.e., principal reflection structure) and a reflection structure 2 5b (i.e., subordinate reflection structure) are provided above the mask plate 3. In order to guarantee that, after being reflected by the subordinate reflection structure, the exposure light irradiates on the region to be exposed of the second substrate via vertical incidence, the reflection plane of the reflection structure 1 5a should be vertical to the reflection plane of the reflection structure 2 5b, and the exposing light source (not shown in this figure) should lie above the reflection structure 1 5a.

FIG. 5 is a schematic flow chart of a method for exposing by employing the exposure system according to this embodiment. As shown in FIG. 5, the exposing method includes:

Step 501: placing a first substrate on which a photoresist is coated on a principal substrate table, and placing a second substrate on which a photoresist is coated on a subordinate substrate table;

Step 502: turning on an exposing light source, and irradiating exposure light on a mask plate, wherein the exposure light passing through a light transmitting region of the mask plate irradiates on the region to be exposed of the first substrate, and the exposure light irradiating on a light reflecting region of the mask plate is reflected to a principal reflection structure, then reflected to a subordinate reflection structure via the principal reflection structure, and then it irradiates on the region to be exposed of the second substrate after being reflected by the subordinate reflection structure.

When a first substrate 2a to be exposed is exposed, the exposing light source is turned on, and exposure light irradiates vertically down to a reflection structure 1 5a with an incidence angle of α. It can be seen that α is determined by γ, and it has the same value as γ, wherein γ is an angle between the principal substrate table and the principal reflection structure. The reflection structure 1 5a is consisted of a light transmitting plate and a reflective layer formed on the light transmitting plate, and the reflective layer is used to reflect the light reflected by the light reflecting region of the mask plate, thus the exposure light may pass through the reflection structure 1 5a. It is hypothesized that the refractive index of the reflection structure 1 5a is n, the emergence angle β of the exposure light after being refracted will be β=arc sin (sin α/n), and when the emergence light reaches the lower surface of the reflection structure 1 5a, the incidence angle will still be β, and the emergence angle will be α. Then, the exposure light penetrating through the reflection structure 1 5a irradiates vertically on a mask plate 3, and after passing through the light transmitting region on the mask plate 3, it irradiates vertically on the region to be exposed of the first substrate 2a. When the exposure light penetrating through the reflection structure 1 5a irradiates vertically on a light reflecting region 4 on the mask plate 3, it reaches a surface of the reflection structure 1 5a after being reflected vertically, and at this point, the incidence angle is α, and the exposure light irradiates on the reflection structure 2 5b after being reflected by the reflection structure 1 5a. Since the reflection structure 1 5a and the reflection structure 2 5b are vertical to each other, the exposure light, after being reflected by the reflection structure 2 5b, irradiates vertically to the region to be exposed on the second substrate 2b.

Preferably, γ may be set as 45°, thus it may guarantee that the exposure light is in a horizontal direction after being reflected by the reflection structure 1 5a, and the exposure light that irradiates on the region to be exposed of the second substrate 2b after being reflected by the light reflecting region 4 is not deformed.

By the exposure system according to this embodiment, two substrates may be exposed at the same time in the same process, and two substrates may also be exposed at the same time in the different processes, so long as that the region to be exposed of the second substrate 2b is contained in the light shielding region of the mask plate 3, that is, the location and size of the region to be exposed of the second substrate 2b do not exceed the light shielding region of the mask plate 3.

Figure 4A:
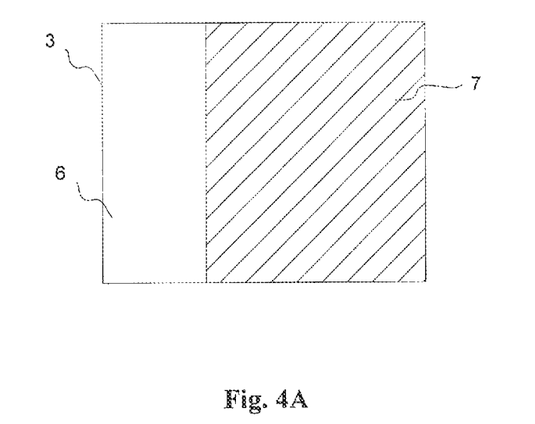
FIG. 4A is a bottom view of the mask plate according to Embodiment 2 of the invention.
Figure 4B:
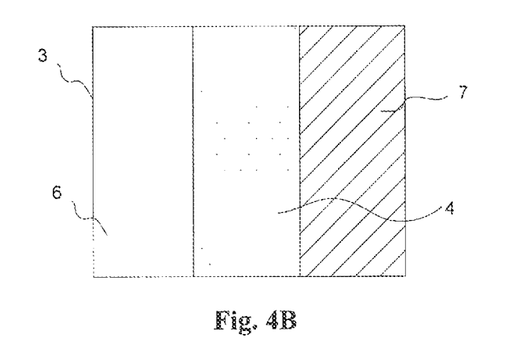
FIG. 4B is a top view of the mask plate according to Embodiment 2 of the invention.

Specifically, this embodiment may be applied to a color filter substrate to manufacture a red color filter region, a green color filter region and a blue color filter region. It is hypothesized that the manufacturing sequence of the color filter substrate is red color filter region, green color filter region and blue color filter region, then a first substrate 1b coated with a red photoresist is placed on the principal substrate table 1a for red photoresist exposure; and at the same time, after the photoetching of the red photoresist is completed on the subordinate substrate table 2a, a green photoresist exposure will be carried out on a second substrate 2b coated with a green photoresist. At this point, the patterns on the mask plate 3 are as shown in FIG. 4A and FIG. 4B. FIG. 4A is a bottom view seen upward from the lower surface of the mask plate 3, wherein the mask plate 3 includes a light transmitting region 6 and a light shielding region 7. When seen upward from the lower surface of the mask plate 3, only the light transmitting region 6 and the light shielding region 7 can be distinguished. When exposure light irradiates on the mask plate 3, the exposure light may pass through the light transmitting region 6 and irradiate on the first substrate 2a to expose a pattern, but it cannot pass through the light shielding region 7. FIG. 4B is a top view seen downward from the upper surface of the mask plate 3, wherein a light reflecting region 4 is provided in the light shielding region 7. When seen downward from the upper surface of the mask plate 3, the light transmitting region 6, the light shielding region 7 and the light reflecting region 4 can be seen. The location and size of the pattern of the light reflecting region 4 correspond to the location and size of the green color filter region, thus the mask plate may not be changed. When the exposure light irradiates on the light shielding region 7, the exposure light that irradiates on the light reflecting region 4 of the light shielding region will be reflected by the above principal reflection structure and subordinate reflection structure, and then irradiate on the second substrate 2b that is placed on the subordinate substrate table 1b, and expose a pattern required.

Moreover, if the manufacturing sequence of the color filter substrate is changed, the substrates placed on the principal substrate table and the subordinate substrate table may also be adjusted according to the manufacturing sequence of the color filter substrate.

Moreover, in order to optimize the exposing effect, the path on which the exposure light reaches the first substrate 2a and the path on which the exposure light reaches the second substrate 2b may be adjusted, so that light intensity of the exposure light that reaches the first substrate 2a will be consistent with the light intensity of the exposure light that reaches the second substrate 2b. Specifically, the light intensity may be adjusted by adjusting the distance between the mask plate 3 and the principal substrate table and/or adjusting the distance between the reflection structure 2 5b and the subordinate substrate table.

Moreover, since the directivity of the light source is poor together with the diffraction effect of a light, when a parallel light is projected, after it propagates for a long distance and is projected after passing through the mask plate, no clear pattern can be formed. Thus it needs to reconverge the light to improve the precision and the light intensity. A UM lens system may be provided between the mask plate 3 and the first substrate 2a, and/or a UM lens system may be provided between the reflection structure 2 5b and the second substrate 2b, and by adjusting the UM lens systems, the light intensity of the light reaching the first substrate 2a and the light intensity of the light reaching the second substrate 2b can be made to meet the requirements at the same time. The UM lens system mainly includes an isosceles trapezoid prism, a concave lens and a convex lens, etc which are commonly used in the prior art.

By applying the exposure system according to this embodiment, a plurality of substrates with different composition patterns may be exposed at the same time, thus not only the purchasing and maintenance of mask plates may be saved, but also the waste of exposure light can be avoided, thereby lowering the production cost of liquid crystal display panels, saving the production time, and improving the production efficiency.

In the above Embodiments 1 and 2, illustrations are given by taking an exposure system including two exposing apparatuses as an example. In practical application, the exposure system of the invention may also include more than three exposing apparatuses. When an exposure system includes three exposing apparatuses, a first substrate on the principal exposing apparatus, a second substrate on the subordinate exposing apparatus and a third substrate on another subordinate exposing apparatus may be exposed at the same time. The exposure system includes: a first mask plate and a first principal reflection structure that are provided above the first substrate; a second mask plate, a second principal reflection structure and a first subordinate reflection structure that are provided above the second substrate; and a second subordinate reflection structure that is provided above the third substrate. The light transmitting region on the first mask plate corresponds to the region to be exposed of the first substrate, and the light shielding region on the first mask plate corresponds to the first light reflecting region of the region to be exposed of the second substrate and corresponds to the second light reflecting region of the region to be exposed of the third substrate. During the exposing process, exposure light passes through the first principal reflection structure and irradiates on the first mask plate, and then it irradiates on the region to be exposed of the first substrate after passing through the light transmitting region of the first mask plate; exposure light irradiating on the first light reflecting region of the first mask plate is reflected to the first principal reflection structure, and it is reflected by the first principal reflection structure to the first subordinate reflection structure corresponding to the second substrate, and after being reflected by the first subordinate reflection structure, it irradiates on the light transmitting region of the second mask plate that is provided on the second substrate, passes through the second mask plate and irradiates on the region to be exposed of the second substrate; exposure light irradiating on the second light reflecting region of the first mask plate is reflected to the first principal reflection structure, and it is reflected by the first principal reflection structure to the first subordinate reflection structure, and after being reflected by the first subordinate reflection structure, it irradiates on the light reflecting region of the second mask plate that is provided on the second substrate, and then it is reflected by the light reflecting region to the second principal reflection structure that is provided on the second substrate, and it is reflected by the second principal reflection structure to the second subordinate reflection structure corresponding to the third substrate, and then it irradiates on the region to be exposed of the third substrate after being reflected by the second subordinate reflection structure. The region to be exposed of the substrate on the subordinate exposing apparatus is contained in the light shielding region of the mask plate, thus when a substrate on the principal exposing apparatus is exposed, the technical solutions of the invention can be applied to expose a substrate on the subordinate exposing apparatus at the same time. Moreover, when the region to be exposed of the substrate on the subordinate exposing apparatus is not contained in the light shielding region of the mask plate, the light shielding region may be made to correspond to the region to be exposed by translating the substrate table, and the irradiating area of the light reflected may be enlarged or the light path may be changed by changing the angle of the substrate table and the light, thus when a substrate on the principal exposing apparatus is exposed, a substrate on the subordinate exposing apparatus may be exposed at the same time. By the technical solutions of the invention, not only the purchase and maintenance of mask plates can be saved, but also the waste of exposure light can be avoided, thereby lowering the production cost of liquid crystal display panels, saving the production time, and improving the production efficiency.

The above description only shows some preferred embodiments of the invention, and it should be appreciated that for one of ordinary skills in the art, many improvements and modifications can be made without departing from the principle of the invention, and all these improvements and modifications fall into the protection scope of the invention.

What is claimed is:

1. An exposure system, comprising a mask plate and a principal reflection structure that is provided above the mask plate, wherein the mask plate comprises a light transmitting region and a light shielding region, the pattern of the light transmitting region corresponds to the pattern of the region to be exposed of a first substrate, a light reflecting region for reflecting exposure light is provided in the light shielding region, and the pattern of the light reflecting region corresponds to the pattern of the region to be exposed of a second substrate; and when exposure light irradiates on the mask plate, passes through the light transmitting region of the mask plate and exposes the first substrate, the light reflecting region of the mask plate reflects the exposure light to the principal reflection structure, and the principal reflection structure further reflects the light, which is reflected by the light reflecting region, to the region to be exposed of the second substrate to expose the second substrate.

2. The exposure system according to claim 1, further comprising:
a subordinate reflection structure, for receiving the light reflected by the principal reflection structure and reflecting it to the region to be exposed of the second substrate.

3. The exposure system according to claim 2, further comprising:
a principal substrate table, for supporting the first substrate;
a light source, for providing the exposure light; and
a subordinate substrate table, for supporting the second substrate.

4. The exposure system according to claim 3, wherein an angle γ between the principal substrate table and the reflection plane of the principal reflection structure is 45°.

5. The exposure system according to claim 2, wherein after being reflected by the subordinate reflection structure, the exposure light irradiates on the region to be exposed of the second substrate via vertical incidence.

6. The exposure system according to claim 2, wherein the reflection plane of the principal reflection structure is vertical to the reflection plane of the subordinate reflection structure.

7. The exposure system according to claim 2, further comprising:
a UM lens system, which is provided between the subordinate reflection structure and the second substrate.

8. The exposure system according to claim 1, further comprising:
a UM lens system, which is provided between the first substrate and the mask plate.

9. The exposure system according to claim 1, wherein the principal reflection structure comprises a light transmitting plate and a reflective layer formed on the light transmitting plate, and the reflective layer is used to reflect a light reflected by the light reflecting region of the mask plate.

10. An exposing method, wherein a substrate is exposed by utilizing the exposure system according to claim 1, and the exposing method comprises:
exposing the second substrate via the exposure light reflected by the light reflecting region of the mask plate when the first substrate is exposed by utilizing the mask plate.

11. The exposing method according to claim 10, wherein the exposure system further comprises:
a subordinate reflection structure, for receiving the light reflected by the principal reflection structure and reflecting it to the region to be exposed of the second substrate.

12. The exposing method according to claim 11, wherein the exposure system further comprises:
a principal substrate table, for supporting the first substrate;
a light source, for providing the exposing light; and
a subordinate substrate table, for supporting the second substrate.

13. The exposing method according to claim 12, wherein an angle γ between the principal substrate table and the reflection plane of the principal reflection structure is 45°.

14. The exposing method according to claim 11, wherein after being reflected by the subordinate reflection structure, the exposure light irradiates on the region to be exposed of the second substrate via vertical incidence.

15. The exposing method according to claim 11, wherein the reflection plane of the principal reflection structure is vertical to the reflection plane of the subordinate reflection structure.

16. The exposure method according to claim 11, wherein the exposure system further comprises:

a UM lens system, which is provided between the subordinate reflection structure and the second substrate.

17. The exposing method according to claim 10, wherein the exposure system further comprises:
a UM lens system, which is provided between the first substrate and the mask plate.

18. The exposure method according to claim 10, wherein the principal reflection structure comprises a light transmitting plate and a reflective layer formed on the light transmitting plate, and the reflective layer is used to reflect a light reflected by the light reflecting region of the mask plate.

* * * * *